(12) United States Patent
Kim (10) Patent No.: US 10,319,937 B2
(45) Date of Patent: Jun. 11, 2019

(54) DISPLAY DEVICE

(71) Applicant: Samsung Display Co., Ltd., Yongin-si (KR)

(72) Inventor: Junyoung Kim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 348 days.

(21) Appl. No.: 14/944,394

(22) Filed: Nov. 18, 2015

(65) Prior Publication Data

US 2016/0218314 A1 Jul. 28, 2016

(30) Foreign Application Priority Data

Jan. 28, 2015 (KR) .......................... 10-2015-0013646

(51) Int. Cl.

| H01L 51/00 | (2006.01) |
| H01L 29/18 | (2006.01) |
| H01L 33/00 | (2010.01) |
| H01L 21/00 | (2006.01) |
| H01L 29/80 | (2006.01) |
| H01L 51/52 | (2006.01) |
| H01L 27/32 | (2006.01) |

(52) U.S. Cl.
CPC ...... H01L 51/5234 (2013.01); H01L 27/3246 (2013.01); H01L 51/5225 (2013.01); H01L 51/5262 (2013.01); *H01L 2251/5315* (2013.01)

(58) Field of Classification Search
CPC ............. H01L 51/5203; H01L 51/5206; H01L 51/5215; H01L 51/5209; H01L 51/5221; H01L 51/5225; H01L 51/5228; H01L 51/5234; H01L 51/5262; H01L 27/3246; H01L 2251/5315
USPC ............... 257/40, 88, 98, E33.062, E51.018; 438/29, 34; 313/404
See application file for complete search history.

(56) References Cited

U.S. PATENT DOCUMENTS

2011/0163339 A1* 7/2011 Negishi ............... H01L 51/5234 257/98
2011/0220922 A1 9/2011 Kim et al.
(Continued)

FOREIGN PATENT DOCUMENTS

| KR | 10-2011-0103735 | 9/2011 |
| KR | 10-2012-0119097 | 10/2012 |

(Continued)

*Primary Examiner* — Fernando L Toledo
*Assistant Examiner* — Aaron J Gray
(74) *Attorney, Agent, or Firm* — H.C. Park & Associates, PLC (57) ABSTRACT

A display device includes a substrate having a light emission area and a non-light emission area, a pixel defining layer disposed in the non-light emission area, the pixel defining layer defining the light emission area, a first electrode disposed in the light emission area, a light emitting layer disposed on the first electrode, and a second electrode disposed on the light emitting layer, in which the second electrode includes a first transmission portion in the light emission area and a second transmission portion on an edge portion of the light emission area, the second transmission portion surrounding the first transmission portion, and the second transmission portion has a light transmittance greater than a light transmittance of the first transmission portion.

15 Claims, 10 Drawing Sheets

(56) References Cited

U.S. PATENT DOCUMENTS

| | | | |
|---|---|---|---|
| 2011/0272675 A1* | 11/2011 | Chung | H01L 27/3246 |
| | | | 257/40 |
| 2012/0268000 A1 | 10/2012 | Choi et al. | |
| 2013/0134450 A1 | 5/2013 | Chang et al. | |
| 2013/0161656 A1* | 6/2013 | Choi | H01L 51/5253 |
| | | | 257/88 |
| 2014/0186978 A1 | 7/2014 | Kang et al. | |
| 2016/0240811 A1* | 8/2016 | Kim | H01L 51/5234 |

FOREIGN PATENT DOCUMENTS

| | | |
|---|---|---|
| KR | 10-2013-0060006 | 6/2013 |
| KR | 10-2014-0088408 | 7/2014 |

* cited by examiner

DISPLAY DEVICE

CROSS-REFERENCE TO RELATED APPLICATION

This application claims priority from and the benefit of Korean Patent Application No. 10-2015-0013646, filed on Jan. 28, 2015, which is hereby incorporated by reference for all purposes as if fully set forth herein.

BACKGROUND

Field

Exemplary embodiments relate to a display device with improved light extraction efficiency and viewing angle property.

Discussion of the Background

Flat panel display devices, such as a liquid crystal display (LCD) and an organic light emitting diode (OLED) display device, may generally include electrode pairs, which may generate an electric field, and an electro-optical active layer disposed therebetween. The LCD device may include a liquid crystal layer as the electro-optical active layer and the OLED display device may include an organic light emitting layer as the electro-optical active layer.

The OLED display device may emit light, when holes and electrons respectively injected from an anode and a cathode are combined with each other within a light emitting unit, such that colors may be displayed. The OLED display device may have a stacked structure, in which a light emitting layer is disposed between the anode serving as a pixel electrode and the cathode serving as an opposing electrode.

In order to improve light extraction efficiency of the OLED display device, research has been conducted into forming each pixel to have a resonance structure therein. The resonance structure may include a transflective electrode as one of the anode and the cathode, which may display an image, and a reflective electrode as the other of the anode and the cathode to oppose thereto, which may generate constructive interference. Accordingly, significantly intensified light may be extracted from each pixel. However, when employing such a resonance structure, which may facilitate intense resonance, although the light extraction efficiency may be increased, the straightness of light propagation may be overly intensified, which may degrade viewing angle properties. As such, a pixel structure that may generate intense resonance may aggravate color shift depending on a viewing angle, which may degrade reliability of the OLED display device.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments are directed to a display device including a second electrode, which includes a first transmission portion and a second transmission portion, each having different light transmittances.

Additional aspects will be set forth in the detailed description which follows, and, in part, will be apparent from the disclosure, or may be learned by practice of the inventive concept.

An exemplary embodiment discloses a display device including a substrate having a light emission area and a non-light emission area, a pixel defining layer disposed in the non-light emission area, the pixel defining layer defining the light emission area, a first electrode disposed in the light emission area, a light emitting layer disposed on the first electrode, and a second electrode disposed on the light emitting layer, in which the second electrode includes a first transmission portion in the light emission area and a second transmission portion on an edge portion of the light emission area, the second transmission portion surrounding the first transmission portion, and the second transmission portion has a light transmittance greater than a light transmittance of the first transmission portion.

An exemplary embodiment further discloses a display device includes a substrate having a light emission area and a non-light emission area, a pixel defining layer disposed in the non-light emission area, the pixel defining layer defining the light emission area, a first electrode disposed in the light emission area, a light emitting layer disposed on the first electrode, and a second electrode disposed on the light emitting layer, in which the second electrode includes a first metal layer and a second metal layer disposed on the first metal layer, and the second metal layer includes an aperture at an edge portion of the light emission area.

An exemplary embodiment also discloses a method of manufacturing a display device including forming a light emission area and a non-light emission area on a substrate, forming a pixel defining layer in the non-light emission area, forming a first electrode in the light emission area, forming a light emitting layer on the first electrode, forming a second electrode on the light emitting layer, and forming a first transmission portion and a second transmission portion in the second electrode, the second transmission portion surrounding the first transmission portion in the light emission area, in which a light transmittance of the second transmission portion is greater than a light transmittance of the first transmission portion.

According to an exemplary embodiment, a display device may enhance light extraction efficiency and improve a viewing angle property, which may increase reliability of the display device.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Hereinafter, unless otherwise stated, a substrate refers to a first substrate. Further, unless otherwise stated, a light emitting layer refers to an organic light emitting layer.

Hereinafter, a display device according to an exemplary embodiment will be described with reference to FIGS. 1 through 6. The display device according to the present exemplary embodiment may be an organic light emitting diode (OLED) display device or a liquid crystal display (LCD) device. Hereinafter, the display device will be described with reference to an OLED display device.

Figure 1:
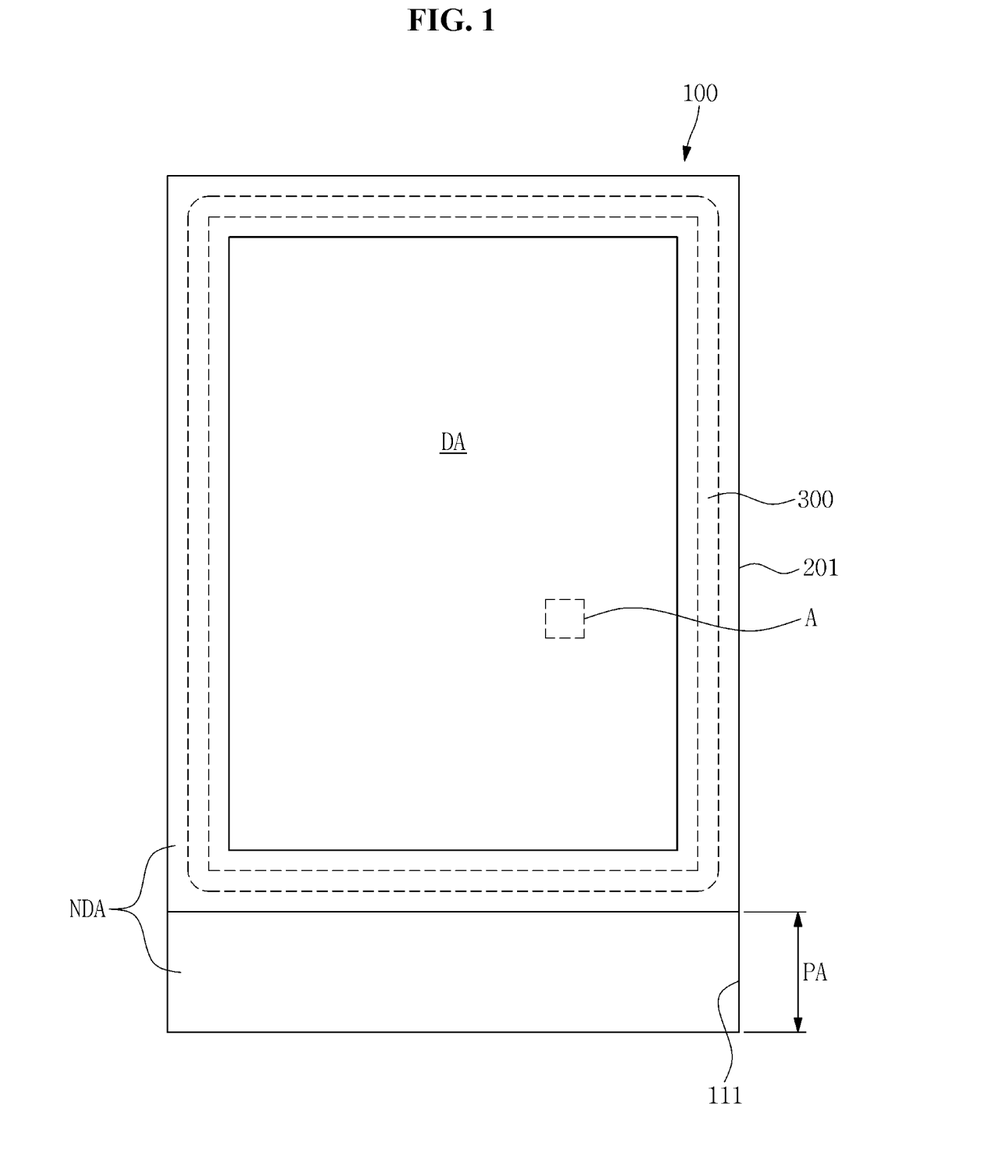
FIG. 1 is a schematic plan view illustrating a display device according to an exemplary embodiment.

FIG. 1 is a schematic plan view illustrating a display device according to the present exemplary embodiment.

Referring to FIG. 1, the OLED display device 100 may include a first substrate 111, a second substrate 201, and a sealant 300. Alternatively, the first substrate 111 may be encapsulated by an encapsulation layer, instead of the second substrate 201.

The first substrate 111 may include a display area DA for displaying an image by light emission, and a non-display area NDA positioned at an outline of the display area DA. An OLED, a thin-film transistor (TFT), and a wiring for driving the OLED may be formed on the display area DA. The non-display area NDA may include a pad area PA, on which pad electrodes (not illustrated) are formed to receive an external signal, which may allow the OLED to emit light and supply the signals to the OLED.

The OLED display device 100 according to the present exemplary embodiment may be a top-emission type display device. Hereinafter, the OLED display device 100 will be described with reference to a top-emission type display device.

Figure 2:
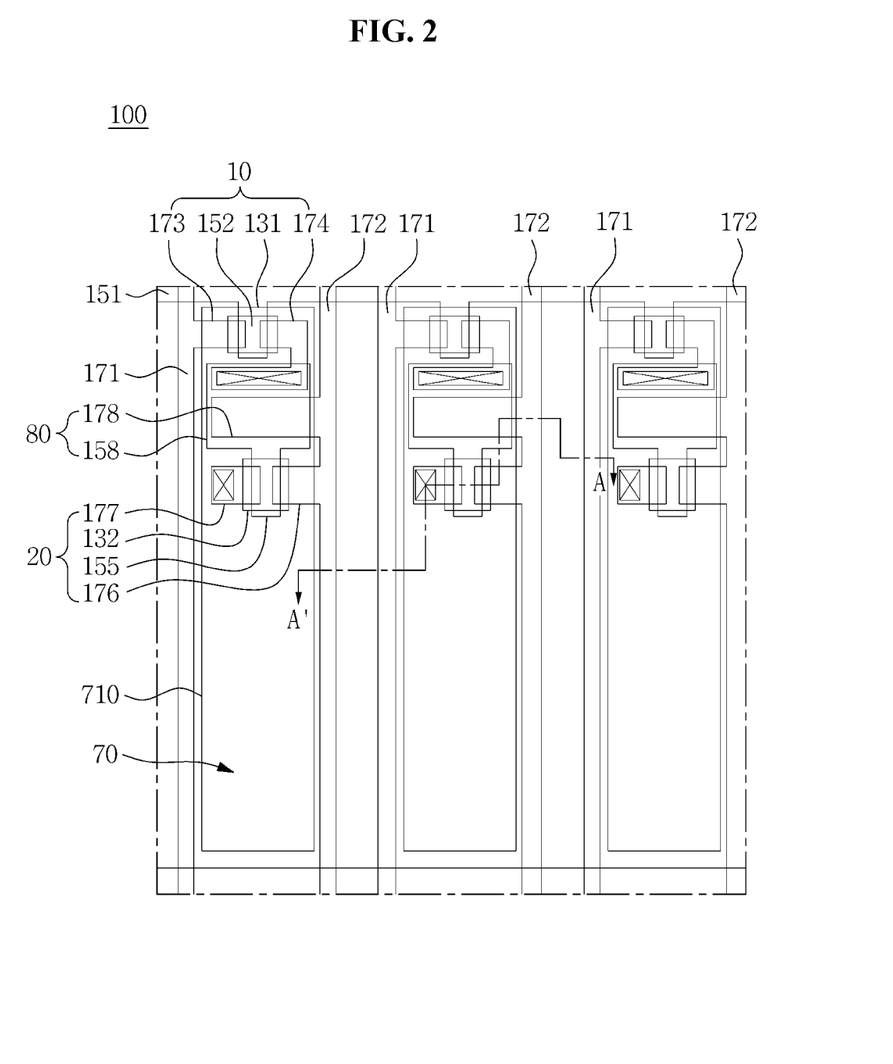
FIG. 2 is an enlarged plan view illustrating area A of FIG. 1.
Figure 3:
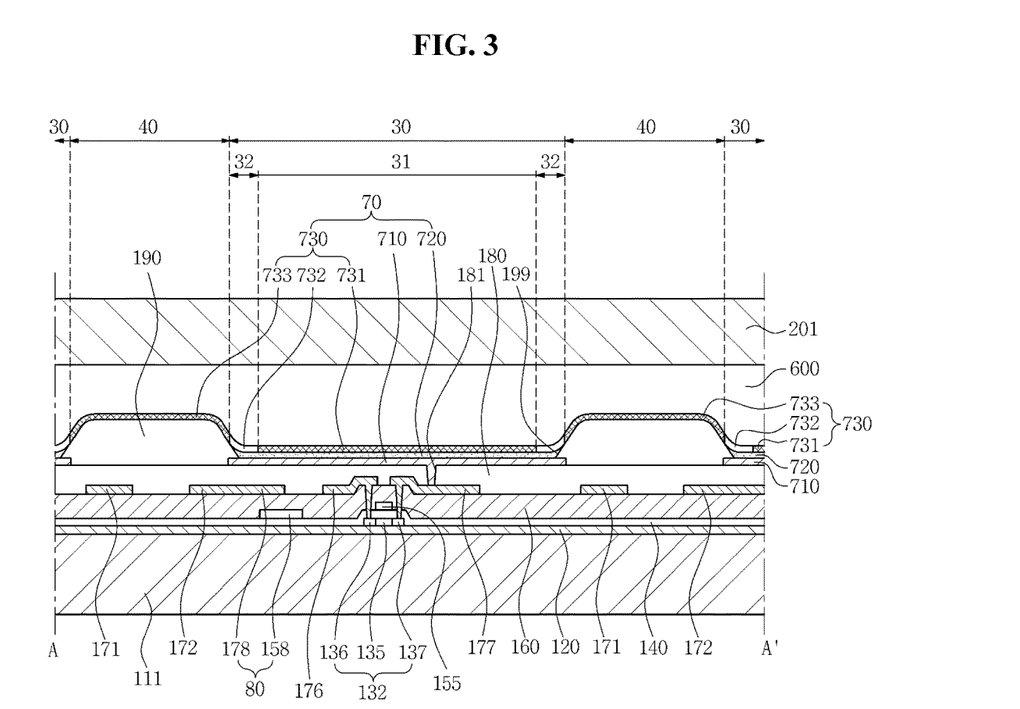
FIG. 3 is a cross-sectional view taken along line A-A' of FIG. 2.

FIG. 2 is an enlarged plan view illustrating area A of FIG. 1. FIG. 3 is a cross-sectional view taken along line A-A' of FIG. 2. The display area DA according to the present exemplary embodiment will be described hereinafter with reference to FIGS. 2 and 3. FIGS. 2 and 3 illustrate an active-matrix type organic light emitting diode (AMOLED) device having a 2 transistor-and-1 capacitor (2Tr-1Cap) structure. For example, the 2Tr-1Cap structure includes two thin-film transistors (TFT) and a capacitor in each pixel. Alternatively, the OLED display device 100 may include three or more TFTs and two or more capacitors 80 in one pixel, and may further include additional wirings. Herein, the term "pixel" refers to a smallest unit for displaying an image, and the display area may display an image using pixels.

The OLED display device 100 according to the present exemplary embodiment may include a first substrate 111 and pixels disposed on the first substrate 111. Each pixel may include a switching TFT 10, the driving TFT 20, the capacitor 80, and the OLED 70. The first substrate 111 may further include a gate line 151 disposed along a first direction, and a data line 171 and a common power line 172 insulated from and intersecting the gate line 151. Each pixel may be defined by the gate, data, and common power lines 151, 171, and 172.

The OLED 70 may include a first electrode 710, an organic light emitting layer 720 disposed on the first electrode 710, and a second electrode 730 disposed on the organic light emitting layer 720. At least one first electrode 710 may be formed on each pixel, such that the first substrate 111 may include first electrodes 710 spaced apart from each other.

The first electrode 710 may be a positive end (anode) serving as a hole injection electrode, and the second electrode 730 may be a negative end (cathode) serving as an electron injection electrode. Alternatively, the first electrode 710 may be a cathode electrode and the second electrode 730 may be an anode electrode, based on the driving scheme of the OLED display device 100. Further, the first electrode 710 may be a pixel electrode, and the second electrode 730 may be a common electrode. The holes and electrons injected to the organic light emitting layer 720 are combined with each other to form an exciton, and then light may be emitted by energy generated when the exciton falls from an excited state to a ground state.

The capacitor 80 may include a pair of storage electrodes 158 and 178 with an insulating layer 160 disposed therebetween. The insulating layer 160 may include a dielectric material. Capacitance of the capacitor 80 may be determined by electric charges accumulated in the capacitor 80 and voltage across the pair of storage electrodes 158 and 178.

The switching TFT 10 may include a switching semiconductor layer 131, a switching gate electrode 152, a switching source electrode 173, and a switching drain electrode 174. The driving TFT 20 may include a driving semiconductor layer 132, a driving gate electrode 155, a driving source electrode 176, and a driving drain electrode 177.

The switching TFT 10 may function as a switching element, which may select a pixel to emit light. The switching gate electrode 152 may be connected to the gate line 151, and the switching source electrode 173 may be connected to the data line 171. The switching drain electrode 174 is spaced apart from the switching source electrode 173 and connected to the first storage electrode 158.

The driving TFT 20 may apply a driving power to the first electrode 710, such that the organic light emitting layer 720 of the OLED 70 in a selected pixel may emit light. The driving gate electrode 155 is connected to the first storage electrode 158, which is connected to the switching drain electrode 174. The driving source electrode 176 and the second storage electrode 178 may be connected to the common power line 172, respectively. The driving drain electrode 177 may be connected to the first electrode 710 of the OLED 70 through a drain contact hole 181. With the above-described structure, the switching TFT 10 may be operated by a gate voltage applied to the gate line 151, and may transmit a data voltage applied to the data line 171 to the driving TFT 20.

Voltage equivalent to a difference between a common voltage applied from the common power line 172 to the driving TFT 20 and the data voltage transmitted from the switching TFT 10 may be stored in the capacitor 80, and current corresponding to the voltage stored in the capacitor 80 may flow to the OLED 70 through the driving TFT 20, so that the OLED 70 may emit light.

The configuration of the OLED display device 100 according to the present exemplary embodiment will be described further with reference to FIG. 3 along with FIG. 2.

The OLED 70, the driving TFT 20, the capacitor 80, the data line 171, and the common power line 172 illustrated in FIG. 3 will be mainly described. The switching semiconductor layer 131, the switching gate electrode 152, the switching source and drain electrodes 173 and 174 of the switching TFT 10 may have the same stacked structure as that of the driving semiconductor layer 132, the driving gate electrode 155, the driving source and drain electrodes 176 and 177 of the driving TFT 20, and thus, duplicated description thereof will be omitted.

According to the present exemplary embodiment, the first substrate 111 may be formed as a first insulating substrate including glass, quartz, ceramic, plastic, or the like. Alternatively, the first substrate 111 may be formed as a first metal substrate including stainless steel or the like.

A buffer layer 120 may be formed on the first substrate 111. The buffer layer 120 may reduce or prevent infiltration of undesirable elements and planarize a surface, and may include various materials in accordance therewith. The buffer layer 120 may be formed of at least one of silicon nitride ($SiN_x$), silicon oxide ($SiO_2$), and silicon oxynitride ($SiO_xN_y$). The buffer layer 120 may be omitted according to the type of the first substrate 111 and process conditions thereof.

The driving semiconductor layer 132 may be formed on the buffer layer 120. The driving semiconductor layer 132 may include at least one semiconductor material of polycrystalline silicon, amorphous silicon, and oxide semiconductors. Further, the driving semiconductor layer 132 includes a channel region 135 that is not doped with impurities, and p+ doped source and drain regions 136 and 137 that are formed on both sides of the channel region 135. In this case, p-type impurities, such as boron (B), may be doped using diborane ($B_2H_6$). The impurities may vary depending on the type of the TFTs.

A gate insulating layer 140 formed of silicon nitride or silicon oxide is formed on the driving semiconductor layer 132. The gate insulating layer 140 may include at least one of tetraethyl orthosilicate (TEOS), silicon nitride (SiN$_x$), and silicon oxide (SiO$_2$). For example, the gate insulating layer 140 may have a double-layer structure, of which a SiN$_x$ layer having a thickness of about 40 nm and a TEOS layer having a thickness of 80 nm are sequentially stacked.

The driving gate electrode 155, the gate line 151 (refer to FIG. 1), and the first storage electrode 158 may be formed on the gate insulating layer 140. The driving gate electrode 155 may be formed to overlap at least a portion of the driving semiconductor layer 132, for example, the channel region 135. The driving gate electrode 155 may prevent the channel region 135 from being doped with impurities, when the source and drain regions 136 and 137 of the driving semiconductor layer 132 are doped with the impurities in the forming of the driving semiconductor layer 132.

The gate electrode 155 and the first storage electrode 158 may be formed on the same layer, and may include substantially the same metal material. The metal material may include at least one of molybdenum (Mo), chromium (Cr), and tungsten (W). According to an exemplary embodiment, the gate electrode 155 and the first storage electrode 158 may include Mo or Mo-alloys.

The insulating layer 160 covering the driving gate electrode 155 may be formed on the gate insulating layer 140. The insulating layer 160 may be an interlayer insulating layer. The insulating layer 160 may be formed of SiN$_x$ or SiO$_x$, as in the gate insulating layer 140. The gate insulating layer 140 and the insulating layer 160 may have a contact hole to expose the source and drain regions 136 and 137 of the driving semiconductor layer 132.

The driving source and drain electrodes 176 and 177, the data line 171, the common power line 172, and the second storage electrode 178 may be formed on the insulating layer 160 of the display area DA. The driving source and drain electrodes 176 and 177 may be connected to the source and drain regions 136 and 137 of the driving semiconductor layer 132 through the contact hole, respectively.

The driving source and drain electrodes 176 and 177, the data line 171, the common power line 172, and the second storage electrode 178 may be formed of refractory metal including at least one of molybdenum, chromium, tantalum, titanium, and alloys thereof, and may have a multilayer structure including a refractory metal layer and a low-resistance conductive layer. Such a multilayer structure may include a double-layer structure including a chromium or molybdenum (alloy) lower film and an aluminum (alloy) upper film, or a triple-layer structure including a molybdenum (alloy) lower film, an aluminum (alloy) middle film, and a molybdenum (alloy) upper film. Alternatively, the driving source and drain electrodes 176 and 177, the data line 171, the common power line 172, and the second storage electrode 178 may be formed of various conductive materials other than the aforementioned materials. Accordingly, the driving TFT 20 including the driving semiconductor layer 132, the driving gate electrode 155, and the driving source and drain electrodes 176 and 177 may be formed.

A passivation layer 180 may be formed on the insulating layer 160 to cover the driving source and drain electrodes 176 and 177, and the like. The passivation layer 180 may be formed of organic materials, such as polyacrylates and polyimides. The passivation layer 180 may be a planarization layer.

The passivation layer 180 may be formed of at least one of polyacrylate resins, epoxy resins, phenolic resins, polyamide resins, polyimide resins, unsaturated polyester resins, poly-phenylenether resins, poly-phenylenesulfide resins, and benzocyclobutene (BCB). The passivation layer 180 may have the drain contact hole 181 to expose the driving drain electrode 177.

The first electrode 710 may be formed on the passivation layer 180 and connected to the driving drain electrode 177 through the drain contact hole 181 of the passivation layer 180. A pixel defining layer 190 may be formed on the passivation layer 180 to cover the first electrode 710.

The pixel defining layer 190 may include an aperture 199 through which the first electrode 710 is exposed. For example, the first electrode 710 may be disposed to correspond to the aperture 199 of the pixel defining layer 190. The pixel defining layer 190 may be formed of resins, such as polyacrylate resins and polyimide resins. Further, the pixel defining layer 190 may be formed of a photosensitive organic material or a photosensitive polymer material. For example, the pixel defining layer 190 may be formed of one of polyacrylates, polyimides, photo sensitive polyimides (PSPI), photosensitive acryl (PA), and photosensitive novolak resins.

The organic light emitting layer 720 may be formed on the first electrode 710 within the aperture 199 of the pixel defining layer 190, and the second electrode 730 may be formed on the pixel defining layer 190 and the organic light emitting layer 720. Accordingly, the OLED 70 may be formed including the first electrode 710, the organic light emitting layer 720, and the second electrode 730.

Meanwhile, when the display device according to the present exemplary embodiment is an LCD device, a first electrode 710 may be physically and electrically connected to a driving drain electrode 177 through a drain contact hole 181, and may receive a data voltage from the driving drain electrode 177. The first electrode 710, which receives the data voltage, along with a second electrode (common electrode) 730, which receives a common voltage, may generate an electric field, which may determine a direction of liquid crystal molecules of a liquid crystal layer (not illustrated) disposed between the two electrodes, such as the first electrode 710 and the second electrode 730. The first electrode 710 and the second electrode 730 may form a capacitor (hereinafter "a liquid crystal capacitor"), which may maintain an applied voltage although the TFT is turned off.

The second substrate 201 may be sealingly attached to the first substrate 111 with the OLED 70 disposed therebetween. The second substrate 201 may cover and protect the TFTs 10 and 20 and the OLED 70 formed on the first substrate 111, such that the TFTs 10 and 20 and the OLED 70 may be sealed from outside. An insulating substrate formed of glass or plastic may be commonly used as the second substrate 201. When the display device is a top-emission type, in which an image is displayed toward the second substrate 201, the second substrate 201 may be formed of a light-transmitting material.

A buffer member 600 may be disposed between the first and second substrates 111 and 201. The buffer member 600 may protect inner elements, such as the OLED 70, from shocks that may be externally applied onto the OLED display device 100. The buffer member 600 may increase device reliability of the OLED display device 100. The buffer member 600 may include at least one of an organic sealant, such as a urethane-based resin, an epoxy-based resin, and an acrylic resin, and an inorganic sealant, such as silicon. The urethane-based resin may include urethane acrylate. The acrylic resin may include butyl acrylate, an ethylhexylacrylate, and the like.

Hereinafter, the OLED 70 according to the present exemplary embodiment will be described further with reference to FIGS. 3, 4, 5, and 6.

Figure 4:
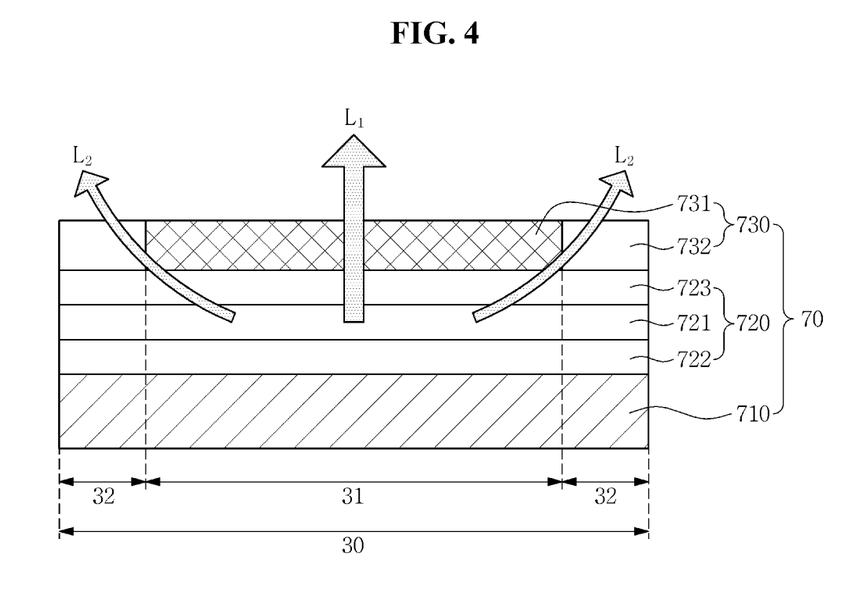
FIG. 4 is a cross-sectional view illustrating an organic light emitting diode of FIG. 2.
Figure 5:
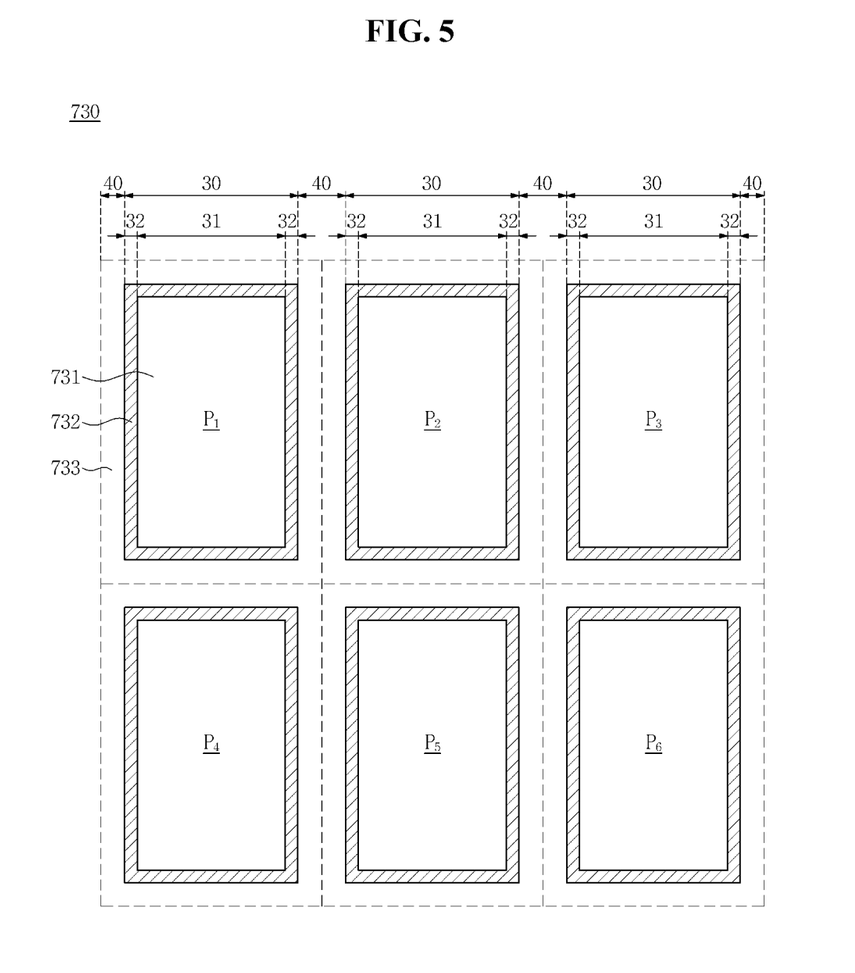
FIG. 5 is a schematic plan view illustrating a second electrode corresponding to a light emission area and a non-light emission area, respectively.
Figure 6:
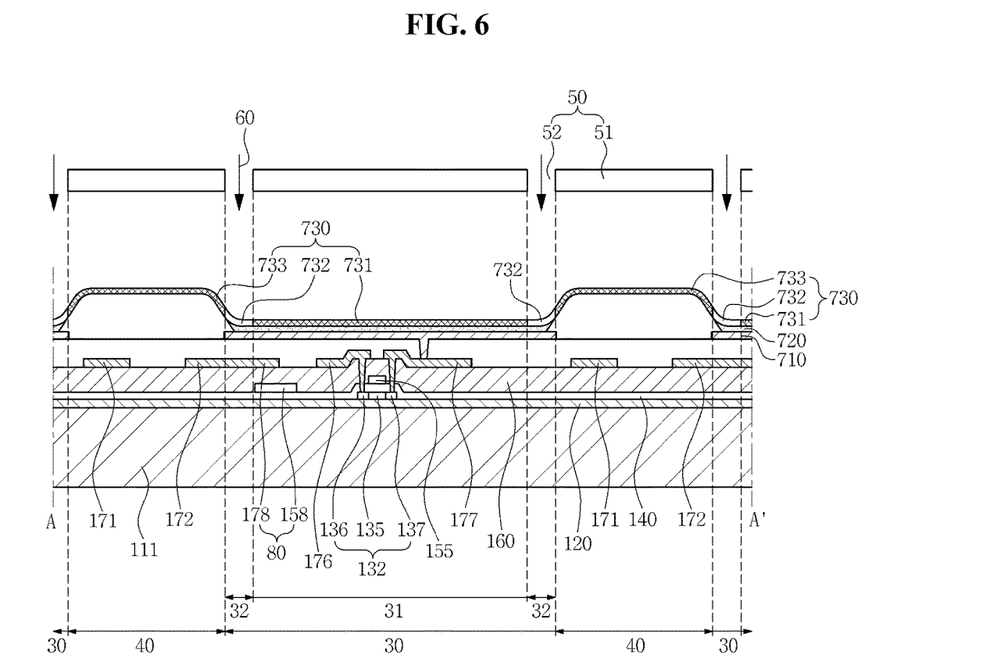
FIG. 6 is a schematic cross-sectional view illustrating a process of manufacturing the second electrode using a mask.

FIG. 4 is a cross-sectional view illustrating the OLED 70 of FIG. 2. FIG. 5 is a schematic plan view illustrating the second electrode 730 corresponding to a light emission area 30 and a non-light emission area 40, respectively. FIG. 6 is a schematic cross-sectional view illustrating a process of manufacturing the second electrode 730 using a mask.

Referring to FIGS. 3 through 5, the first substrate 111 may have the light emission area 30 and the non-light emission area 40. The light emission area 30 may be an area through which light may be emitted to the outside, and may be defined by the pixel defining layer 190. The non-light emission area 40 may be an area through which light may not be emitted and on which the pixel defining layer 190 may be disposed. The pixel defining layer 190 may be disposed on the non-light emission area 40 and define the light emission area 30.

The light emission area 30 may have a first area 31 and a second area 32. The second area 32 may disposed in an edge portion of the light emission area 30, surrounding the first area 31. The OLED 70 may include the first electrode 710, the organic light emitting layer 720, and the second electrode 730.

The first electrode 710 may be disposed on the light emission area 30 and be formed of a reflective conductive material. The reflective material may include at least one of lithium (Li), calcium (Ca), lithium fluoride/calcium (LiF/Ca), lithium fluoride/aluminum (LiF/Al), aluminum (Al), silver (Ag), magnesium (Mg), or gold (Au).

The first electrode 710 may include a first sub-electrode (not illustrated), which may include a light reflective conductive material having a monolayer or multilayer structure including at least one of Li, Ca, LiF/Ca, LiF/Al, Al, Ag, Mg, and Au, and a second sub-electrode (not illustrated), which is disposed on the first sub-electrode and including a conductive material having a relatively high work function, such as indium tin oxide (ITO).

The organic light emitting layer 720 may be disposed on the first electrode 710, and be formed of a low molecular weight organic material or a high molecular weight organic material. The organic light emitting layer 720 may include a main light emitting layer 721, a hole organic layer 722, and an electron organic layer 723. The main light emitting layer 721 may be a layer, in which holes and electrons respectively injected from the first electrode 710 and the second electrode 730 may be combined with each other. The hole organic layer 722 may include at least one of a hole injection layer (HIL) and at least one of a hole transporting layer (HTL). The electron organic layer 723 may include at least one of an electron transporting layer (ETL) and at least one of an electron injection layer (EIL).

Accordingly, the organic light emitting layer 720 may have a multilayer structure including at least one of the main light emitting layer 721, the hole injection layer (HIL), the hole transporting layer (HTL), the electron transporting layer (ETL), and the electron injection layer (EIL). The hole injection layer (HIL) may be disposed on the first electrode 710, which may be a positive end, and the hole transporting layer (HTL), the main light emitting layer 721, the electron transporting layer (ETL), and the electron injection layer (EIL) may be sequentially stacked thereon.

According to the present exemplary embodiment, the organic light emitting layer 720 is formed only within the aperture 199 of the pixel defining layer 190. Alternatively, at least one layer of the organic light emitting layer 720 may be disposed on the first electrode 710 and between the pixel defining layer 190 and the second electrode 730, within the aperture 199 of the pixel defining layer 190. For example, the hole injection layer (HIL), the hole transporting layer (HTL), the electron transporting layer (ETL), the electron injection layer (EIL), and the like of the organic light emitting layer 720 may be formed in an area spaced apart from the aperture 199, by using an open mask, and the main light emitting layer 721 of the organic light emitting layer 720 may be formed on each aperture 199, by using a fine metal mask (FMM).

The second electrode 730 may be disposed on the organic light emitting layer 720, and may include a transflective conductive material, such that a resonance structure may be formed. The second electrode 730 may include a light transflective conductive material having a monolayer or multilayer structure including at least one of lithium (Li), magnesium (Mg), lithium aluminum (LiAl), aluminum (Al), silver (Ag), calcium (Ca), calcium-silver (CaAg), magnesium-silver (MgAg), and aluminum-silver (AlAg).

The second electrode 730 may have a planar shape, and may be formed over an entire surface of the first substrate 111 as a single plate form. The second electrode 730 may include a first transmission portion 731 disposed in the light emission area 30 and a second transmission portion 732 disposed in an edge portion of the light emission area 30, to surround the first transmission portion 731. The first transmission portion 731 may be disposed in the first area 31 and the second transmission portion 732 may be disposed in the second area 32.

The first transmission portion 731 and the second transmission portion 732 may include the same transflective conductive material, and the second transmission portion 732 may include oxides including a transflective conductive material. For example, when the first transmission portion 731 has a multilayer structure including Mg and Ag, the second transmission portion 732 may have a multilayer structure including magnesium oxide and silver oxide.

Referring to FIG. 6, the second transmission portion 732 of the second electrode 730 may be oxidized by using a mask 50. More particularly, a light shielding unit 51 of the mask 50 is arranged to correspond to the first transmission portion 731 and the third transmission portion 733, and a light transmission portion 52 of the mask 50 is arranged to correspond to the second transmission portion 732. Subsequently, oxygen ($O_2$) may be injected into the light transmission portion 52 in a chamber at an oxidation atmosphere. The second transmission portion 732 exposed to oxygen may be oxidized into a transflective conductive material. The mask 50 may be a fine metal mask (FMM).

As the transflective conductive material includes an oxide, the second transmission portion 732 may have a light transmittance greater than that of the first transmission portion 731. For example, the second transmission portion 732 may have a light transmittance that may be about 1.1 to about 2 times the light transmittance of the first transmission portion 731. Accordingly, when the first transmission portion 731 has a light transmittance of 30%, the second transmission portion 732 may have a light transmittance of about 50%.

The first transmission portion 731 may account for about 60% to about 90% of the size of the second electrode 730 corresponding to the light emission area 30. The second transmission portion 732 may account for about 10% to about 40% of the size of the second electrode 730 corresponding to the light emission area 30. More particularly, the size of the first area 31 and the size of the second area 32 may have a ratio in a range of about 9:1 to about 6:4.

The second electrode 730 may further include a third transmission portion 733 surrounding the second transmission portion 732. The third transmission portion 733 may be disposed in the non-light emission area 40. The third transmission portion 733 may include the same material and have the same light transmittance as those of the first transmission portion 731.

When the second electrode 730 has the above-described configuration, as illustrated in FIG. 4, light emitted from the organic light emitting layer 720 may be directed outwards through the first area 31 and through the second area 32 via different emission mechanisms, respectively.

More particularly, the second transmission portion 732, which overlaps the second area 32, is an area having a high light transmittance, and thus light (L2, hereinafter "second light") passing through the second transmission portion 732 may be directed outwards with low resonance efficacy. However, since the first transmission portion 731, which overlaps the first area 31, may have the same light transmittance as that of the conventional transmission portion, light L1 (hereinafter "first light") passing through the first transmission portion 731 may have a greater light intensity by virtue of the resonance effect. That is, the first light L1 may propagate back and forth between the first electrode 710 and the first transmission portion 731, and thereby form a micro-cavity. In this manner, the first light L1 may cause constructive interference, and thus have a greater light intensity.

As the condition, in which the constructive interference may readily occur in terms of an interval between the first electrode 710 and the second electrode 730, may be slightly different between light of red, green, and blue colors R, G, and B, respectively, the interval between the first electrode 710 and the second electrode 730 may be adjusted based on the colors of light. In other words, since the interval between the first electrode 710 and the second electrode 730, which may allow the constructive interference to occur, may be proportional to the wavelength of light, when the interval is suitably adjusted based on each corresponding color, light having a greater intensity may be obtained. Accordingly, the first light L1, which may be intensified through the micro-cavity, may be directed outwards through the first transmission portion 731.

The second light L2, which exhibits low resonance effect, and the first light L1, which is intensified by the resonance effect, may be mixed together to be emitted through the single light emission area 30, such that a combined effect of the weak-resonance light emission and the strong-resonance light emission may be obtained, thus improving light extraction efficiency and a viewing angle property.

More particularly, since the first light L1 directed outwards from the first transmission portion 731 is intensified through the resonance, the first light L1 may exhibit increased intensity and straightness. As the light extraction efficiency increases, the straightness of light may also increase, and thus, a significant change in luminance and chromatic coordinate may occur when the viewing angle is slightly out from the center of the screen. However, since the second light L2 is directed outwards from the second transmission portion 732 with a mitigated resonance effect, the second light L2 may exhibit a diminished increase in light extraction efficiency, but an improved viewing angle property. In other words, since the second electrode 730 according to the present exemplary embodiment includes the second transmission portion 732, the second electrode 730 may compensate degradation of the viewing angle property.

Hereinafter, an OLED display device according to an exemplary embodiment will be described with reference to FIGS. 7, 8, 9A, 9B, and 9C. The OLED display device may have substantially the same configuration as the OLED display device illustrated with reference to FIGS. 1 to 6, and thus, duplicated description thereof ill be omitted.

Figure 7:
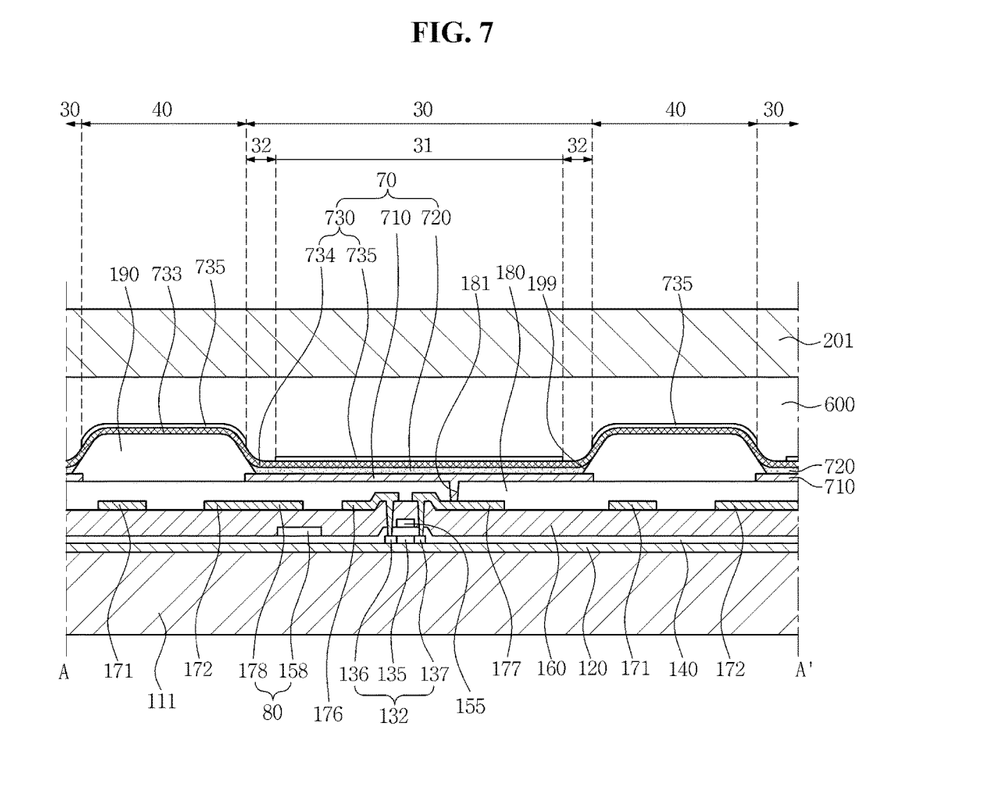
FIG. 7 is a schematic cross-sectional view illustrating a display device according to an exemplary embodiment.
Figure 8:
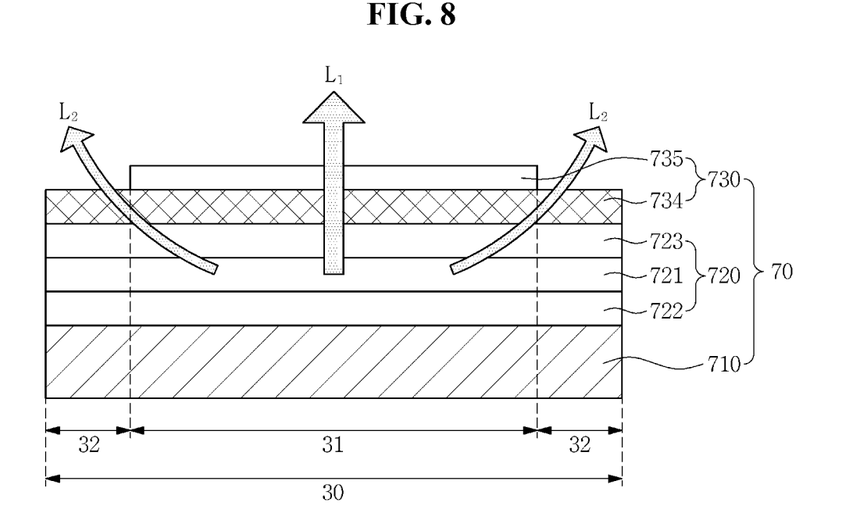
FIG. 8 is a cross-sectional view illustrating an organic light emitting diode of FIG. 7.

FIG. 7 is a schematic cross-sectional view illustrating the display device according to an exemplary embodiment. FIG. 8 is a cross-sectional view illustrating the OLED of FIG. 7.

Referring to FIGS. 7 and 8, a second electrode 730 according to the present exemplary embodiment may include a first metal layer 734 and a second metal layer 735. The second metal layer 735 may have an aperture at an edge portion of a light emission area 30. The second metal layer 735 may account for about 60% to about 90% of the size of the second electrode 730 corresponding to the light emission area 30.

The second electrode 730 may have a multilayer structure including the first metal layer 734 and the second metal layer 735 in a first area 31, and may have a monolayer structure including the first metal layer 734 in a second area 32. Accordingly, the light transmittance of the second electrode 730 corresponding to the edge portion of the light emission area 30 may be about 1.1 to about 2 times the light transmittance of the second electrode 730 corresponding to the center of the light emission area 30. That is, the light transmittance of the second electrode 730 overlapping the second area 32 may be about 1.1 to about 2 times the light transmittance of the second electrode 730 overlapping the first area 31. Accordingly, the second electrode 730 according to the present exemplary embodiment may have different thickness, such that light transmittance may be enhanced in a portion of the second electrode 730 overlapping the second area 32.

The first metal layer 734 and the second metal layer 735 may include at least one of Li, Mg, LiAl, Al, Ag, Ca, CaAg, MgAg, and AlAg. The first metal layer 734 and the second metal layer 735 may be also disposed on a non-light emission area 40.

Hereinafter, a method of manufacturing the second electrode 730 according to the present exemplary embodiment will be described with reference to FIGS. 9A, 9B, and 9C. According to the present exemplary embodiment, the first metal layer 734 may be formed of Mg and the second metal layer 735 may be formed of Ag.

Figure 9A:
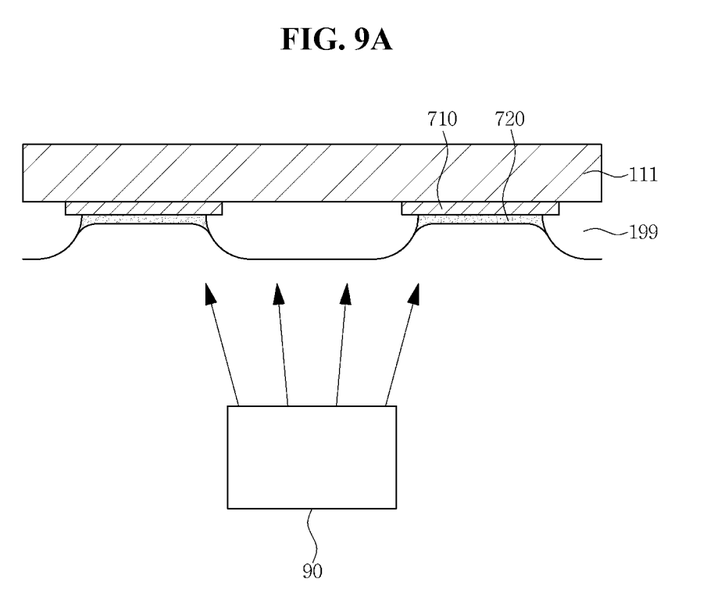
FIGS. 9A, 9B, and 9C are cross-sectional views illustrating a method of manufacturing a display device according to an exemplary embodiment.
Figure 9B:
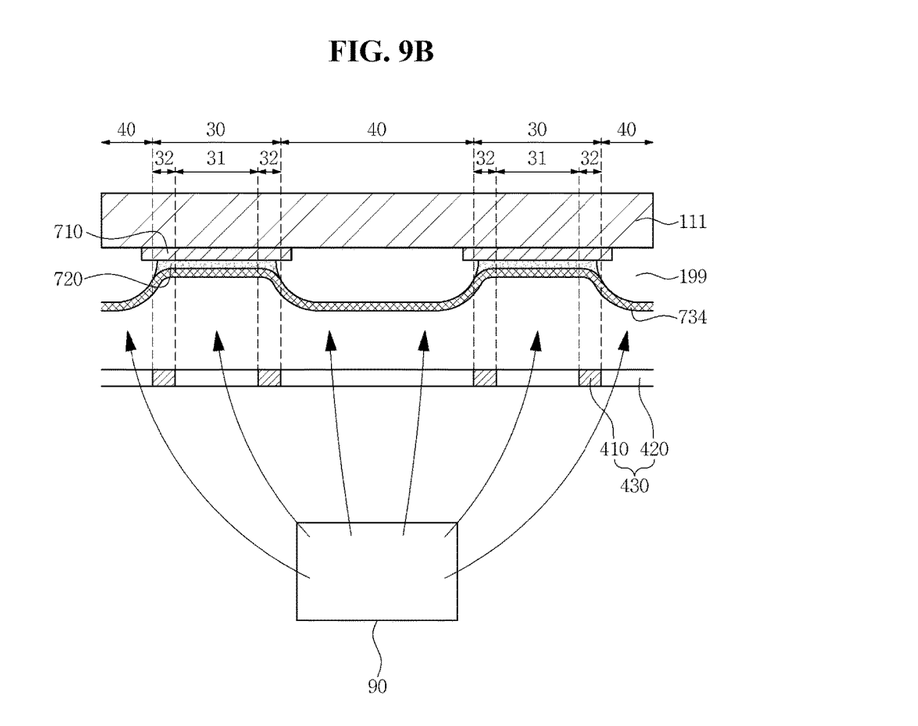
Figure 9C:
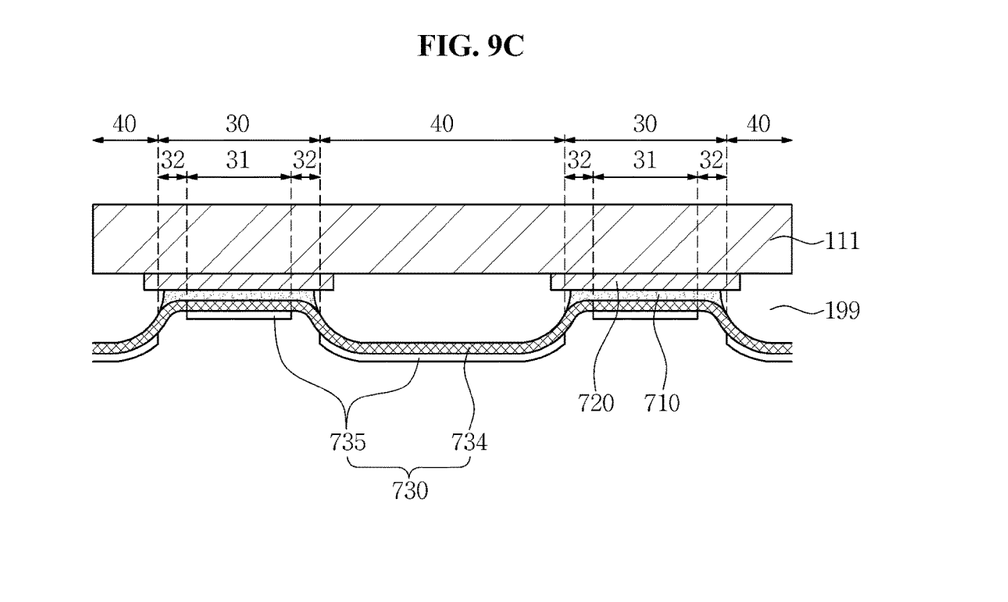

FIGS. 9A, 9B, and 9C are cross-sectional views illustrating a method of manufacturing the display device according to the present exemplary embodiment.

Referring to FIG. 9A, a deposition source 90 is disposed below the first substrate 111, and heat may be applied to the deposition source 90, so that Mg of the deposition source 90 may be irradiated toward the pixel defining layer 190 and the light emitting layer 720, such that the first metal layer 734 may be formed.

Referring to FIG. 9B, a shielding portion 410 of a deposition mask 400 is arranged to correspond to the second area 32, and a slit 420 of the deposition mask 400 is arranged to correspond to the first area 31 and the non-light emission area 40. Subsequently, heat is applied to the deposition source 90, such that Ag of the deposition source 90 may be irradiated toward the first area 31 and the non-light emission area 40, such that the second metal layer 735 may be formed.

When the display device is manufactured as illustrated in FIGS. 9A, 9B, and 9C, the first metal layer 734 and the second metal layer 735 may be formed, of which a light transmittance of the second electrode 730 overlapping the second area 32 may be a greater than a light transmittance in other portions of the second electrode 730.

Although certain exemplary embodiments and implementations have been described herein, other embodiments and modifications will be apparent from this description. Accordingly, the inventive concept is not limited to such exemplary embodiments, but rather to the broader scope of the presented claims and various obvious modifications and equivalent arrangements.

What is claimed is:

1. A display device, comprising:
a substrate comprising a light emission area and a non-light emission area;
a pixel defining layer disposed in the non-light emission area, the pixel defining layer defining the light emission area;
a first electrode disposed in the light emission area;
a light emitting layer disposed on the first electrode; and
a second electrode disposed on the light emitting layer, wherein:
the second electrode comprises:
a first transmission portion disposed in the light emission area; and
a second transmission portion disposed on an edge portion of the light emission area, the second transmission portion surrounding each side of the first transmission portion;
the second transmission portion has a light transmittance greater than a light transmittance of the first transmission portion;
the second electrode is a common electrode configured to infect holes or electrons; and
the second transmission portion continuously surrounds each side of the first transmission portion.

2. The display device of claim 1, wherein the first transmission portion accounts for about 60% to about 90% of the size of the second electrode in the light emission area.

3. The display device of claim 2, wherein the second transmission portion accounts for about 10% to about 40% of the size of the second electrode in the light emission area.

4. The display device of claim 1, wherein the second electrode comprises at least one of lithium (Li), magnesium (Mg), lithium-aluminum (LiAl), aluminum (Al), silver (Ag), calcium (Ca), calcium-silver (CaAg), magnesium-silver (MgAg), and aluminum-silver (AlAg).

5. The display device of claim 4, wherein the second transmission portion comprises at least one oxide of lithium (Li), magnesium (Mg), lithium-aluminum (LiAl), aluminum (Al), silver (Ag), calcium (Ca), calcium-silver (CaAg), magnesium-silver (MgAg), and aluminum-silver (AlAg).

6. The display device of claim 5, wherein the light transmittance of the second transmission portion is about 1.1 to about 2 times the light transmittance of the first transmission portion.

7. The display device of claim 1, wherein the second electrode further comprises a third transmission portion surrounding the second transmission portion.

8. The display device of claim 7, wherein the third transmission portion is disposed in the non-light emission area.

9. The display device of claim 8, wherein the third transmission portion has the same light transmittance as the first transmission portion.

10. A method of manufacturing a display device, the method comprising:
forming a light emission area and a non-light emission area on a substrate;
forming a pixel defining layer in the non-light emission area;
forming a first electrode in the light emission area;
forming a light emitting layer on the first electrode;
forming a second electrode on the light emitting layer; and
forming a first transmission portion and a second transmission portion in the second electrode, the second transmission portion surrounding each side of the first transmission portion in the light emission area,
wherein:
a light transmittance of the second transmission portion is greater than a light transmittance of the first transmission portion;
the second electrode is a common electrode which injects holes or electrons; and
the second transmission portion continuously surrounds each side of the first transmission portion.

11. The method of claim 10, wherein:
the first electrode comprises a reflective conductive material; and
the second electrode comprises a transflective conductive material.

12. The method of claim 11, wherein the first transmission portion comprises about 60% to 90% of the size of the second electrode in the light emission area.

13. The method of claim 12, wherein forming the first transmission portion and the second transmission portion in the second electrode comprises oxidizing an edge portion of the first transmission portion corresponding to the second transmission portion.

14. The method of claim 13, further comprising forming a third transmission portion in the non-light emission area, wherein the first transmission portion and the third transmission portion comprise the same material and light transmittance.

15. The method of claim 12, wherein forming the first transmission portion and the second transmission portion comprises:
forming a first metal layer on the light emitting layer; and
forming a second metal layer on a portion of the first metal layer, such that the second metal layer exposes an edge portion of the first metal layer in the light emission area.

* * * * *